(12) United States Patent
Lewicki et al.

(10) Patent No.: US 7,233,173 B1
(45) Date of Patent: Jun. 19, 2007

(54) SYSTEM AND METHOD FOR PROVIDING A LOW JITTER DATA RECEIVER FOR SERIAL LINKS WITH A REGULATED SINGLE ENDED PHASE INTERPOLATOR

(75) Inventors: Laurence D. Lewicki, Sunnyvale, CA (US); Amjad T. Obeidat, Santa Clara, CA (US); Nicolas Nodenot, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 161 days.

(21) Appl. No.: 10/973,743

(22) Filed: Oct. 26, 2004

(51) Int. Cl.
*G11C 7/00* (2006.01)
(52) U.S. Cl. ............... 327/57; 327/76; 327/96; 327/97
(58) Field of Classification Search ............. None
See application file for complete search history.

(56) References Cited

U.S. PATENT DOCUMENTS

| | | | | |
|---|---|---|---|---|
| 4,162,416 A | * | 7/1979 | Beecham et al. | 327/57 |
| 5,377,150 A | * | 12/1994 | McClure | 365/207 |
| 5,508,644 A | * | 4/1996 | Branson et al. | 327/57 |
| 6,331,793 B1 | * | 12/2001 | Fletcher et al. | 327/51 |
| 6,411,131 B1 | * | 6/2002 | Ang et al. | 327/52 |
| 6,833,737 B2 | * | 12/2004 | Aipperspach | 327/55 |
| 2003/0002607 A1 | * | 1/2003 | Mooney et al. | 375/355 |
| 2003/0132790 A1 | * | 7/2003 | Amick et al. | 327/158 |
| 2003/0210078 A1 | * | 11/2003 | Wijetunga et al. | 327/52 |
| 2004/0022339 A1 | * | 2/2004 | Nakao | 375/376 |
| 2005/0060616 A1 | * | 3/2005 | Cho et al. | 714/34 |
| 2005/0201491 A1 | * | 9/2005 | Wei | 375/326 |
| 2006/0188051 A1 | * | 8/2006 | Donnelly et al. | 375/371 |

* cited by examiner

*Primary Examiner*—Tuan T. Lam

(57) ABSTRACT

A system and method is disclosed for providing a clock and data recovery circuit that comprises a low jitter data receiver. The low jitter data receiver comprises a phase interpolator, an amplifier unit and a data sampling comparator. The phase interpolator and the amplifier unit provide the data sampling comparator with a single ended clock signal that is relatively immune to power supply noise. The data sampling comparator samples an input data stream with minimal jitter due to power supply noise. The data sampling comparator consumes less static power than a current mode logic D flip flop and also has output levels that are compatible with complementary metal oxide semiconductor (CMOS) logic.

22 Claims, 6 Drawing Sheets

SYSTEM AND METHOD FOR PROVIDING A LOW JITTER DATA RECEIVER FOR SERIAL LINKS WITH A REGULATED SINGLE ENDED PHASE INTERPOLATOR

TECHNICAL FIELD OF THE INVENTION

The present invention is generally directed to the manufacture of clock and data recovery circuits for semiconductor devices and, in particular, to a system and method for providing a low jitter data receiver using a regulated single ended phase interpolator.

BACKGROUND OF THE INVENTION

Digital systems usually contain several individual elements. For example, a personal computer may have a central processing unit (CPU), a graphics processing chip, memory units, and other types of components. A central challenge in the design of digital systems is to provide reliable, error-free high speed communications between the various elements of a digital system.

High speed digital communications may be carried out by using either a parallel bus or a high speed serial bus. One example of a parallel bus is the Peripheral Component Interface (PCI) bus. The PCI bus is a parallel bus that is sixty four (64) bits wide and that is clocked at a speed of thirty three megahertz (33 MHz).

Large parallel bus systems such as the PCI bus have exhibited sufficient performance for existing personal computer systems. However, as the speed of digital communications systems increases, parallel bus structures are becoming widely recognized as having limitations. The limitations of parallel bus structures are due to the difference in propagation delay between the fastest line and the slowest line on a parallel bus.

High speed serial data links mitigate the problem presented by the propagation delay difference between the fastest line and the slowest line of a parallel bus by "embedding" a high speed clock signal within the data. The receiver receives the data with the embedded clock signal and extracts the clock information and the data simultaneously. The circuit that performs this function is referred to as a "clock and data recovery circuit" (CDR circuit).

A CDR circuit is connected to and interfaces with a data signal line that carries the incoming data stream. The CDR circuit performs the function of extracting the incoming data and clock information from the incoming data stream. This function is typically performed with an electronic control loop that detects the incoming data. Based on the data edge locations in time, the electronic control loop makes a determination of the instantaneous phase of the data.

The electronic control loop subsequently aligns the electronic control loop's own internal clock with the phase of the incoming data. This alignment allows the CDR circuit to sample the data in the middle of the bit period to ensure that a maximum signal-to-noise ratio is achieved. The aligned clock signal is also referred to as the recovered clock signal because it represents a clock signal that is synchronous with the recovered data.

There are two main architectures in the prior art that are used to construct a clock and data recovery (CDR) circuit. The primary difference between the two systems is the way the recovered clock signal is generated. A first CDR type system generates the recovered clock signal with a voltage controlled oscillator (VCO). The VCO based system is capable of generating the recovered clock signal at the same frequency as the data. In addition, the VCO based system can vary the recovered clock phase to match the phase of the data.

A second CDR type system uses a phase interpolator to vary the phase of a reference clock signal that is supplied to it from another on-chip block (typically, a phase-lock loop (PLL)) that produces a nominal clock frequency that matches the nominal frequency of the incoming data. The interpolator produces a new clock signal with an interpolated phase that is varied to match the phase of the incoming data. This clock signal is then used to sample the data in the middle of the bit period. The interpolated clock signal, in this case, is also referred to as a recovered clock signal. Even though this system (i.e., the interpolated phase system) uses a reference clock signal with a fixed frequency, it can still adjust the interpolated clock frequency to match the variation in frequency of the incoming data. The frequency shift is accomplished by continuously varying the phase of the interpolated clock signal to translate it into a frequency shift.

The electronic control loop uses a phase detector at its input to compare the phase of the incoming data to the phase of the internal clock signal. The phase detector determines whether the clock phase is early or late relative to the incoming data signal. The electronic control loop subsequently makes a decision to vary the phase of the internal clock signal in such a way as to eliminate the phase difference between the clock signal and the incoming data signal.

The data sampling is accomplished through the use of input comparators that are driven from one or more phases of the internal (i.e., recovered) clock signal. Under ideal conditions, these comparators sample each data bit in the middle of the bit period and make a determination whether the bit is zero or the bit is one and pass on the decision as the recovered data. A clock and data recovery (CDR) circuit of the phase interpolator variety tracks an incoming data stream by continuously varying the phase of the internal (i.e., recovered) clock signal through phase interpolation.

In order for a CDR circuit to accurately extract the embedded clock signal from the serial data stream, the CDR circuit may introduce only a small amount of clock jitter. Clock jitter may be created by several sources. For example, clock jitter may be due to residual error from the phase detection process. Clock jitter may also be due to local oscillator noise. Clock jitter may also be due to injected power supply noise.

Prior art serial link receivers often use a current mode logic (CML) style D flip flop circuit in the data sampling comparator circuit. CML D flip flop circuits have an advantage in that they use differential clocks and are therefore fairly immune to power supply noise because both the inverting and non-inverting clock inputs are essentially balanced during switching.

CML D flip flop circuits, however, have a disadvantage because the CML circuitry consumes static power. A second disadvantage of CML flip flop circuits is that their full differential output levels are not compatible with standard CMOS logic. It would be advantageous to provide a data sampling comparator of a clock and data recovery circuit that does not have these prior art disadvantages.

Therefore, there is a need in the art for a system and method for providing a clock and data recovery circuit that has comprises a low jitter data receiver. There is also a need in the art for a system and method for providing a clock and data recovery circuit that consumes less static power than the power consumed by CML D flip flop circuits. There is also a need in the art for a system and method for providing a clock and data recovery circuit that has a low transfer function of power supply noise to sampling clock jitter.

SUMMARY OF THE INVENTION

To address the above-discussed deficiencies of the prior art, it is a primary object of the present invention to provide a system and method for providing a clock and data recovery circuit that comprises a low jitter data receiver.

In one advantageous embodiment of the present invention, a low jitter data receiver is provided for a clock and data recovery circuit. The low jitter data receiver comprises a phase interpolator, an amplifier unit and a data sampling comparator. The phase interpolator and the amplifier unit provide the data sampling comparator with a single ended clock signal that is relatively immune to power supply noise.

The output of the amplifier unit that is provided to the data sampling comparator comprises a complementary metal oxide semiconductor (CMOS) clock signal that tracks the value of the positive power supply voltage. The value of the positive power supply voltage minus the value of the CMOS clock signal is substantially constant.

This allows the data sampling comparator to sample an input data stream with minimal jitter due to power supply noise. The data sampling comparator also consumes less static power than a current mode logic D flip flop. The data sampling comparator has output levels that are compatible with complementary metal oxide semiconductor (CMOS) logic.

It is an object of the present invention to provide a system and method for providing a clock and data recovery circuit that comprises a low jitter data receiver.

It is also an object of the present invention to provide a system and method for providing a clock and data recovery circuit that consumes less static power than the power consumed by common mode logic (CML) D flip flop circuits.

It is yet another object of the present invention to provide a system and method for providing a clock and data recovery circuit that has a low transfer function of power supply noise to sampling clock jitter.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
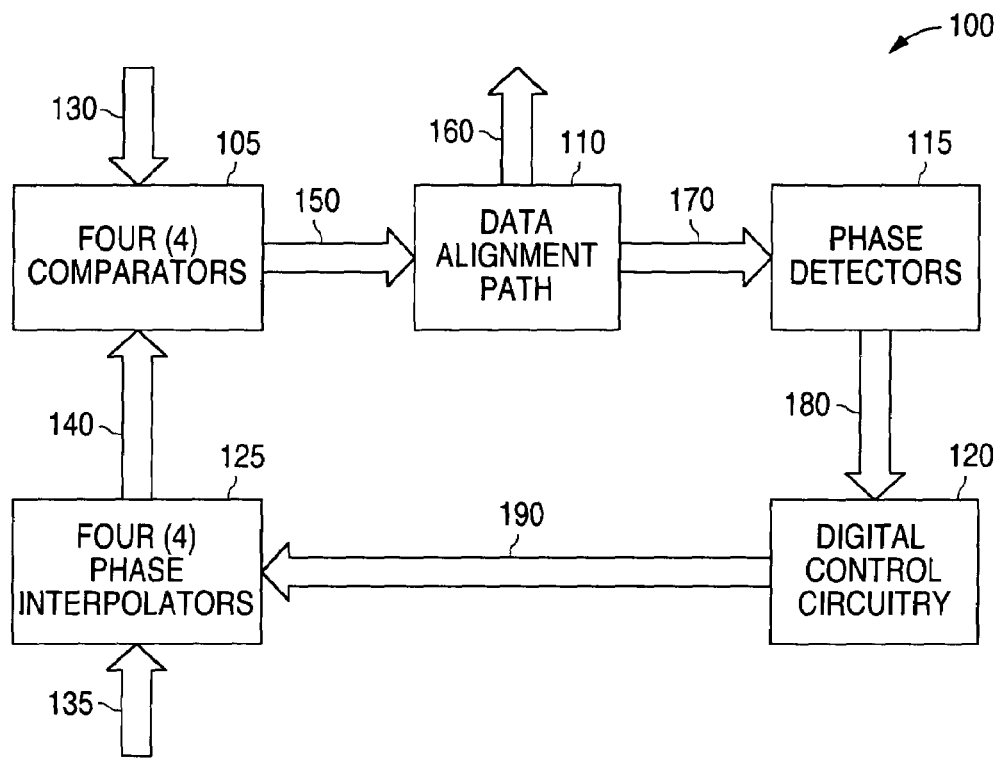
FIG. 1 illustrates a schematic representation of a prior art clock and data recovery circuit.

FIGS. 1 through 7B and the various embodiments used to describe the principles of the present invention in this patent document are by way of illustration only and should not be construed in any way to limit the scope of the invention. Those skilled in the art will understand that the principles of the present invention may be implemented in any type of suitably arranged clock and data recovery circuit.

To simplify the drawings the reference numerals from previous drawings will sometimes not be repeated for structures that have already been identified.

In order to better understand the principles of the present invention a description of a prior art clock and data recovery system will first be given. FIG. 1 illustrates a schematic diagram of a prior art clock and data recovery circuit 100 that employs phase interpolator architecture. The clock and data recovery circuit 100 requires four (4) clock phases that are generated by a phase locked loop (PLL) (not shown in FIG. 1). The four clock phases are ninety degrees (90°) apart in phase and run at one half of the frequency of the incoming data stream. The four clock phases from the PLL are represented in FIG. 1 by arrow 135. The four clock phases are provided to a bank of four (4) phase interpolators 125 that are used to generate the recovered clock signal. The four interpolated clock phases from the four interpolators 125 (represented by arrow 140) are used to drive four input comparators 105 that sample the incoming data stream. The incoming data stream is represented in FIG. 1 by arrow 130.

The sampled data from the four input comparators 105 is provided to a data alignment path unit 110. The sampled data that is provided to the data alignment path unit 110 is represented in FIG. 1 by arrow 150. The data alignment path unit 110 provides an output signal that represents the clock and data output. The clock and data output from data alignment path unit 110 is represented in FIG. 1 by arrow 160.

The data alignment path unit 110 also provides an output signal to phase detectors 115. The output signal from data alignment path unit 110 to phase detectors 115 is represented in FIG. 1 by arrow 170. The phase detectors 115 determine whether the sampling moment is early or late for each bit. If the phase detectors 115 are not able to make a determination whether the sampling moment is early or late for each bit, they output a signal that represents a "no information" result. The phase detectors 115 provide an output that represents the "early/late/no info" information to digital control circuitry 120. The output that represents the "early/late/no info" information is represented in FIG. 1 by arrow 180.

The digital control circuitry 120 operates on the information from the phase detectors 115 to determine the appropriate clock phase to be used. The loop is completed when the digital control circuitry 120 sends interpolator control signals to the four phase interpolators 125. The interpolator control signals from digital control circuitry 120 are represented in FIG. 1 by arrow 190.

When the four input comparators 105 sample the incoming data stream 130 the four input comparators 105 translate portions of the incoming data stream 130 into a logic zero ("0") or a logic one ("1"). There are four (4) comparators in the input comparator block 105 that perform this function. These four comparators are driven by a variable phase clock signal (i.e., the recovered clock signal) to sample the signal in the middle of the data bit period.

As data is received, the bit stream is analyzed by the logic section of clock and data recovery circuit 100. The logic section comprises the data alignment path unit 110, the phase detectors 115, and the digital control circuitry 120. As previously mentioned, the phase detectors 115 determine whether the sampling moment is early or late (or no information is available) for each bit. The phase detectors 115 provide the "early/late/no info" decisions 180 to the digital control circuitry 120.

The digital control circuitry 120 accumulates the "early/late/no info" decisions and makes a determination whether the phase of the sampling clock should be advanced or retarded. The determination that is made with respect to advancing or retarding the sampling clock is translated into control signals 190 to be provided to the phase interpolators 125. The phase interpolators, in response, adjust the phase of the sampling clocks that feed into the four input comparators 105.

The clock and data recovery circuit 100 shown in FIG. 1 is capable of operating at frequencies that are lower than the frequency of the input data stream 130. In particular, the four input comparators 105 allow the clock and data recovery circuit 100 to sample the incoming data stream 130 at one half of the data rate of the incoming data stream 130. Further parallelization in the data path in the logic section of the clock and data recovery circuit 100 enables the frequency of the logic section to be decreased by an additional factor of two or more.

The clock and data recovery circuit 100 shown in FIG. 1 comprises a mixture of analog blocks and digital blocks that are connected in a loop that controls the clock and data recovery function. The clock and data recovery circuit 100 works by taking two samples for every incoming bit. The first sample is a data sample in the middle of the bit period and the second sample is an edge sample in the bit transition region. The clock and data recovery circuit 100 samples two bits at a time by employing four input comparators 105 that are sampling with a phase shift of ninety degrees (90°) between each of the four input comparators 105.

Figure 2:
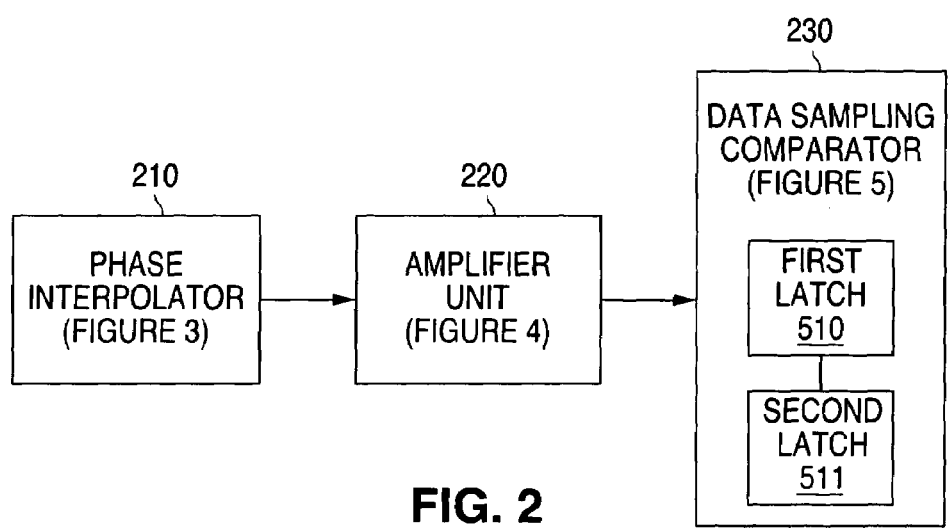
FIG. 2 illustrates a schematic representation of a phase interpolator, amplifier unit, and data sampling comparator of a receiver of a clock and data recovery circuit in accordance with the principles of the invention.
Figure 3:
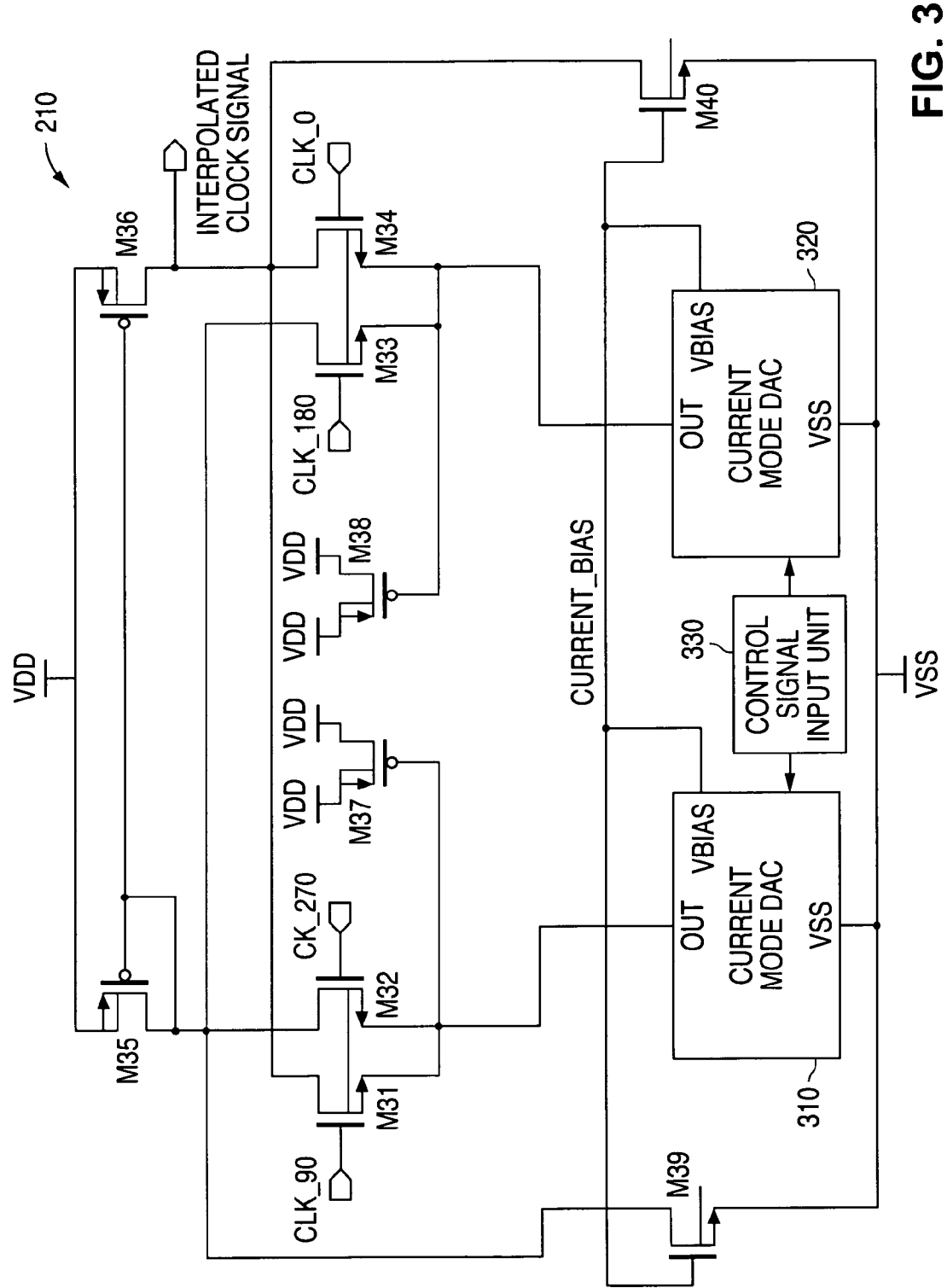
FIG. 3 illustrates a circuit diagram of the phase interpolator of the invention shown in FIG. 2.
Figure 4:
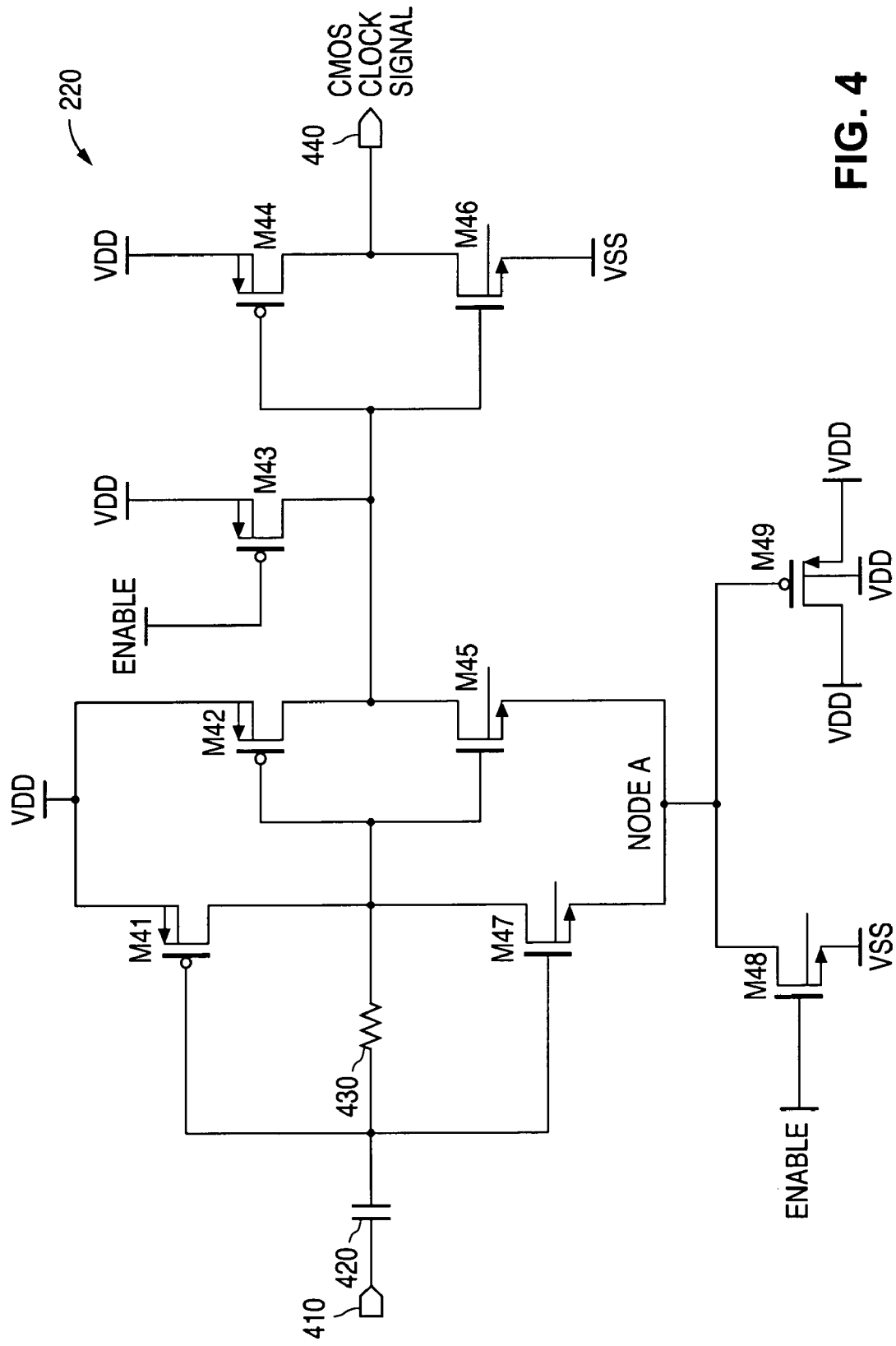
FIG. 4 illustrates a circuit diagram of the amplifier unit of the invention shown in FIG. 2.
Figure 5:
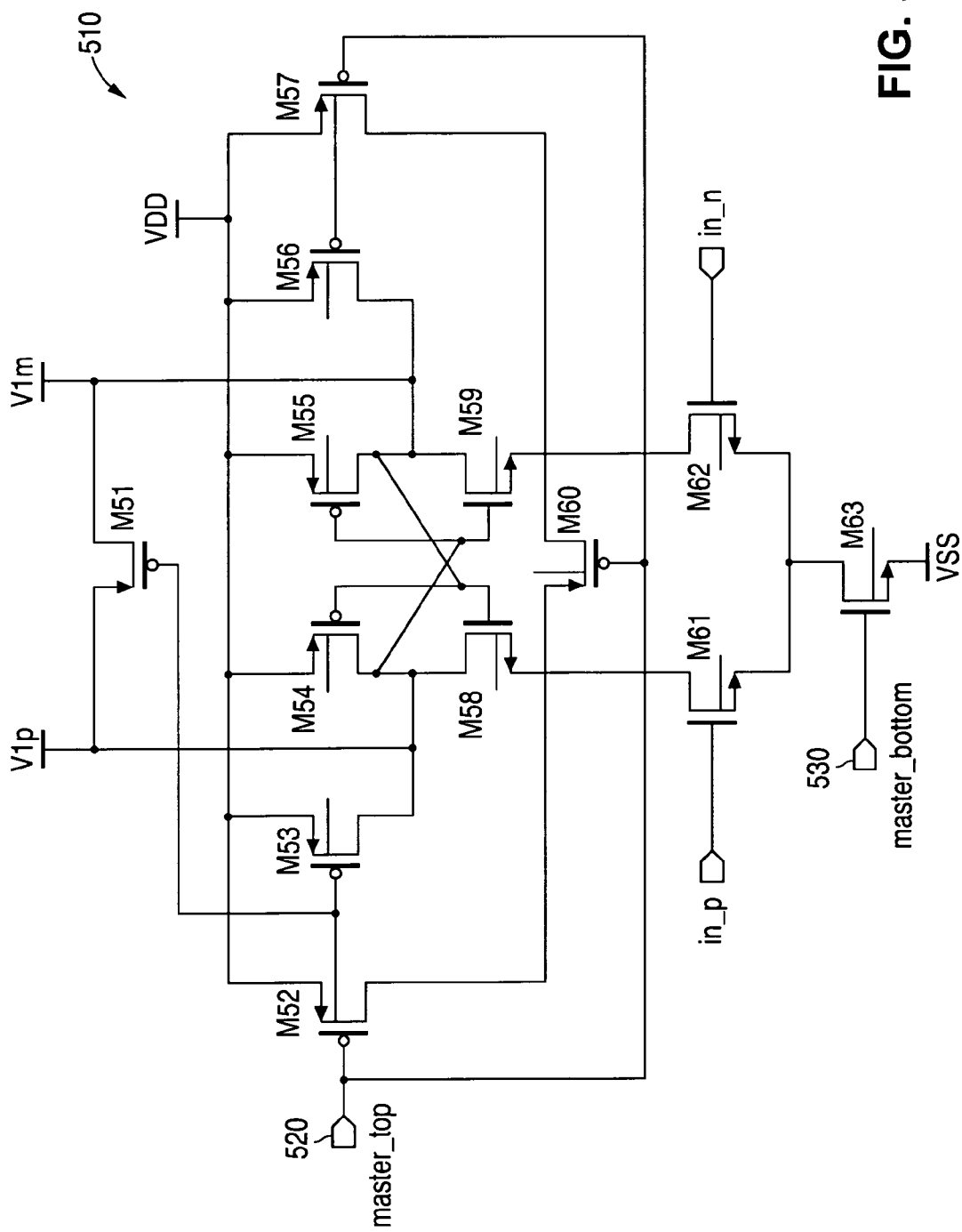
FIG. 5 illustrates a circuit diagram of a data sampling comparator of the invention shown in FIG. 2.

FIG. 2 illustrates a schematic representation of a phase interpolator 210, amplifier unit 220, and data sampling comparator 230 of a receiver of a clock and data recovery circuit in accordance with the principles of the invention. FIG. 3 illustrates an exemplary circuit diagram of the phase interpolator 210. FIG. 4 illustrates an exemplary circuit diagram of the amplifier unit 220. FIG. 5 illustrates an exemplary circuit diagram of a latch circuit 510 of the data sampling comparator 230.

The operation of data sampling comparator 230 will be described first. Turning now to FIG. 5, it is seen that data sampling comparator 230 comprises a latch circuit 510. Data sampling comparator 230 actually comprises two (2) latches 510–511 that are strobed on opposite clock phases. One of the two latch circuits is shown in FIG. 5 as latch circuit 510. The latch circuit 510 comprises an NMOS differential pair that comprises NMOS transistor M61 and NMOS transistor M62. The gate of NMOS transistor M61 receives one side of a differential input data signal that contains an embedded clock signal. The differential input data and embedded clock signal is designated as "in_p–in_n". The side of the differential input data and embedded clock signal that is received by the gate of NMOS transistor M61 is designated as "in_p". The gate of NMOS transistor M62 receives the second side of the differential input data signal that contains the embedded clock signal. The second side of the differential input data and embedded clock signal is designated as "in_n".

The NMOS differential pair (M61, M62) feed two cross coupled inverters as a load. The first cross coupled inverter comprises transistor M54 and transistor M58. The second cross coupled inverter comprises transistor M55 and transistor M59. This configuration has been chosen because it provides a fast latch that does not consume static power.

The gate of PMOS transistor M52 receives a CMOS clock signal from the output of amplifier unit 220 shown in FIG. 4. The CMOS clock signal that is provided to node 520 of latch circuit 510 is designated as "master_top". The gate of NMOS transistor M63 also receives the CMOS clock signal from the output of amplifier unit 220 shown in FIG. 4. The CMOS clock signal that is provided to node 530 of latch circuit 510 is designated as "master_bottom".

When the CMOS clock signal that is fed to the latch circuit 510 is low, all of the nodes are precharged to the positive VDD supply voltage by the PMOS devices (M51, M52, M53, M56, M57, and M60). When the CMOS clock signal rises, first NMOS transistor M63 turns on the differential input pair (M61, M62). Then the precharge PMOS devices (M51, M52, M53, M56, M57, and M60) turn off. This enables the latch circuit 510 to latch.

Note that the critical event that latches the data at the receiver input is the turning off of the PMOS devices (M51, M52, M53, M56, M57, and M60). More specifically, note that this event occurs when the strobe signal gets within approximately one Vtp of the positive VDD supply voltage rail. This feature was used to design the clock generator to be essentially insensitive to the noise on the positive VDD supply voltage rail by referencing the strobe signal to this same positive VDD supply voltage.

A second latch circuit 511 in data sampling comparator 230 samples the value from the first latch circuit 510 approximately one half cycle later. At this time the first latch circuit 510 is holding its decision firmly, so that the clocking of the second latch circuit 511 is not critical and full CMOS levels are used. This master/slave pipelining results in predictable data settling time control for the downstream flip flop circuits. Predictable data settling time control is essential for error free operation at frequencies that are greater than one gigahertz (>1 GHz) with an eighteen hundredths micron (0.18 μm) CMOS process.

Data sampling comparator 230 (1) fulfills the system speed constraints, and (2) interfaces easily to downstream circuits because its voltage level is full CMOS and also because its output timing is well controlled.

The discussion set forth above shows that in order to sample the input data stream without jitter due to power supply noise it is necessary to create a strobe signal for the PMOS devices of the first latch circuit 510 that "tracks" the positive VDD supply voltage rail. The present invention provides a phase interpolator circuit 210 and amplifier circuit 220 that is capable of outputting a single ended clock signal that is relatively immune to power supply noise.

The principle of operation of a phase interpolator is to generate an output clock signal that is the result of interpolating two input clock signals with the same frequency but with different phases. The resulting output clock signal has the same frequency as the input clocks with an adjustable phase. By modifying the relative weight of one input clock versus the other input clock, the phase interpolator generates a clock signal with a phase interpolated between the two input clock signals.

The operation of phase interpolator 210 will now be described. Turning now to FIG. 3, it is seen that phase interpolator 210 comprises a left side differential pair that comprises transistor M31 and transistor M32. Transistor M31 is fed with a first clock signal (e.g., ninety degrees (90°)) and transistor M32 is fed with the clock signal complement (e.g., two hundred twenty degrees (270°) of the first clock signal).

Phase interpolator 210 also comprises a right side differential pair that comprises transistor M33 and transistor M34. The right side differential pair (M33, M34) is fed with a second clock signal that is typically offset in phase ninety degrees (90°) from the first clock signal that is fed to the left side differential pair. For example, a second clock signal of zero degrees (0°) is fed to transistor M34 and a second clock signal complement of one hundred eighty degrees (180°) is fed to transistor M33.

The source of the left side differential pair (M31, M32) is biased with a current mode digital to analog converter (DAC) 310. The source of the right side differential pair (M33, M34) is biased with a current mode digital to analog converter (DAC) 320. The current mode DAC 310 and the current mode DAC 320 are complementary in operation. This means that as the current in one of the current mode DACs increases, the current in the other current mode DAC decreases.

The input of current mode DAC 310 and the input of current mode DAC 320 are each coupled to a control signal input unit 330. Control signal input unit 330 provides digital control signals to operate current mode DAC 310 and current mode DAC 320. The current mode DAC 310 and the current mode DAC 320 each provide an interpolator current source for phase interpolator 210.

The drain of transistor M32 of the left side differential pair (M31, M32) and the drain of transistor M33 of the right side differential pair (M33, M34) are wired together and also wired to the drain of transistor M35 of a current mirror (M35, M36) that comprises transistor M35 and transistor M36. The drain of transistor M31 of the left side differential pair (M31, M32) and the drain of transistor M34 of the right side differential pair (M33, M34) are wired together and are also wired to the drain of transistor M36 of the current mirror (M35, M36).

The tail current of current mode DAC 310 decreases while the tail current of current mode DAC 320 increases. Similarly, the tail current of current mode DAC 310 increases while the tail current of current mode DAC 320 decreases. This means that the current mirror (M35, M36) load remains constant. The current mirror (M35, M36) load converts the differential sum signal to a single ended signal that is referenced to the positive VDD power supply. The interpolated clock signal that is the output of phase interpolator 210 is obtained at the drain of transistor M36 of the current mirror (M35, M36).

The current mode DAC 310 and the current mode DAC 320 are digitally controlled through control signal input unit 330. This means that the output phase of phase interpolator 210 is also digitally controlled.

The common source node of the right side differential pair (M31, M32) is bypassed to the positive VDD power supply by PMOS transistor M37 configured as an inversion capacitance. Similarly, the common source node of the left side differential pair (M33, M34) is bypassed to the positive VDD power supply by PMOS transistor M38 configured as an inversion capacitance. The presence of the capacitance provided by PMOS transistor M37 and the presence of the capacitance provided by PMOS transistor M38 dramatically reduces the amount of jitter at the output of phase interpolator 210 due to power supply noise.

The advantageous embodiment described above illustrates a case in which phase interpolator 210 uses clock signals that are ninety degrees (90°) apart. However, it is also possible to implement clock signals that have other values of phase relationship. For example, in one advantageous embodiment six (6) clock phases from a three (3) element ring oscillator could be used to generate sixty degree (60°) phase spacing. The use of different clock phase relationships does not affect the operation of phase interpolator 210.

The advantageous embodiment described above illustrates a case in which phase interpolator 210 uses a unary DAC configuration to provide the interpolator current sources. However, it is also possible to implement other DAC designs without changing the functionality of phase interpolator 210. For example, in one advantageous embodiment a binary weighted DAC could be used. Alternatively, a segmented DAC (i.e., a combination of a binary weighted DAC and a unary DAC) could also be used without affecting the operation of phase interpolator 210.

The interpolated clock signal at the output of phase interpolator 210 is now single ended. The interpolated clock signal at the output of phase interpolator 210 is subject to jitter that is induced by the power supply noise. It is desirable to minimize the output jitter from phase interpolator 210.

The interpolated clock signal at the output of phase interpolator 210 has been filtered and therefore has slow edges. As a consequence, the interpolated clock signal is very sensitive to power supply line noise creating timing edge jitter.

FIG. 4 illustrates a circuit diagram of the amplifier unit 220. The interpolated clock signal at the output of phase interpolator 210 is provided to amplifier unit 220 through input node 410. As shown in FIG. 4, the signal passes through capacitor 420 to a first inverter circuit that comprises transistor M41 and transistor M47. The output of the first inverter circuit (M41, M47) is coupled to the input of a second inverter circuit that comprises transistor M42 and transistor M45. Resistor 430 is used as a bias resistor for the first inverter circuit (M41, M47). The source of transistor M41 and the source of transistor M42 are both coupled to the positive VDD power supply. The source of transistor 47 and the source of transistor M45 are both coupled to Node A.

The negative VSS power supply is coupled to Node A through transistor M48 configured as a resistive element. Although this embodiment utilizes transistor 48 configured as a resistive element, any resistive element (e.g., polysilicon) could be used. The local negative power supply at Node A is capacitatively coupled to the positive VDD power supply through transistor M49 configured as a capacitance.

The interpolated clock signal from input node 410 is amplified by two amplifier stages that are powered by the local negative power supply at Node A. The use of the local negative power supply transforms the slow edge output of the phase interpolator 210 (which are necessary for the linear time deltas due to the digital control) to a fast edge output. The fast edge output is essentially insensitive to power supply variations. The fast edge output clock signal is used to drive the last amplifier to a full CMOS level output at output node 440.

Recall that the input stage sampling clock transition point for latch circuit 510 of data sampling comparator 230 is located at VDD-Vtp. To create the lowest jitter clock source for data sampling comparator 230 the power supply for the two amplifiers in the amplifier unit 220 have also been referenced to the positive VDD power supply.

The CMOS clock signal that appears at output node 440 of the amplifier circuit 220 of FIG. 4 tracks the value of the positive VDD power supply. In other words, the value of the quantity represented by the positive VDD power supply minus the CMOS clock signal remains substantially constant. As the value of the positive VDD power supply fluctuates, the CMOS clock signal tracks the value of the positive VDD power supply.

Figure 6:
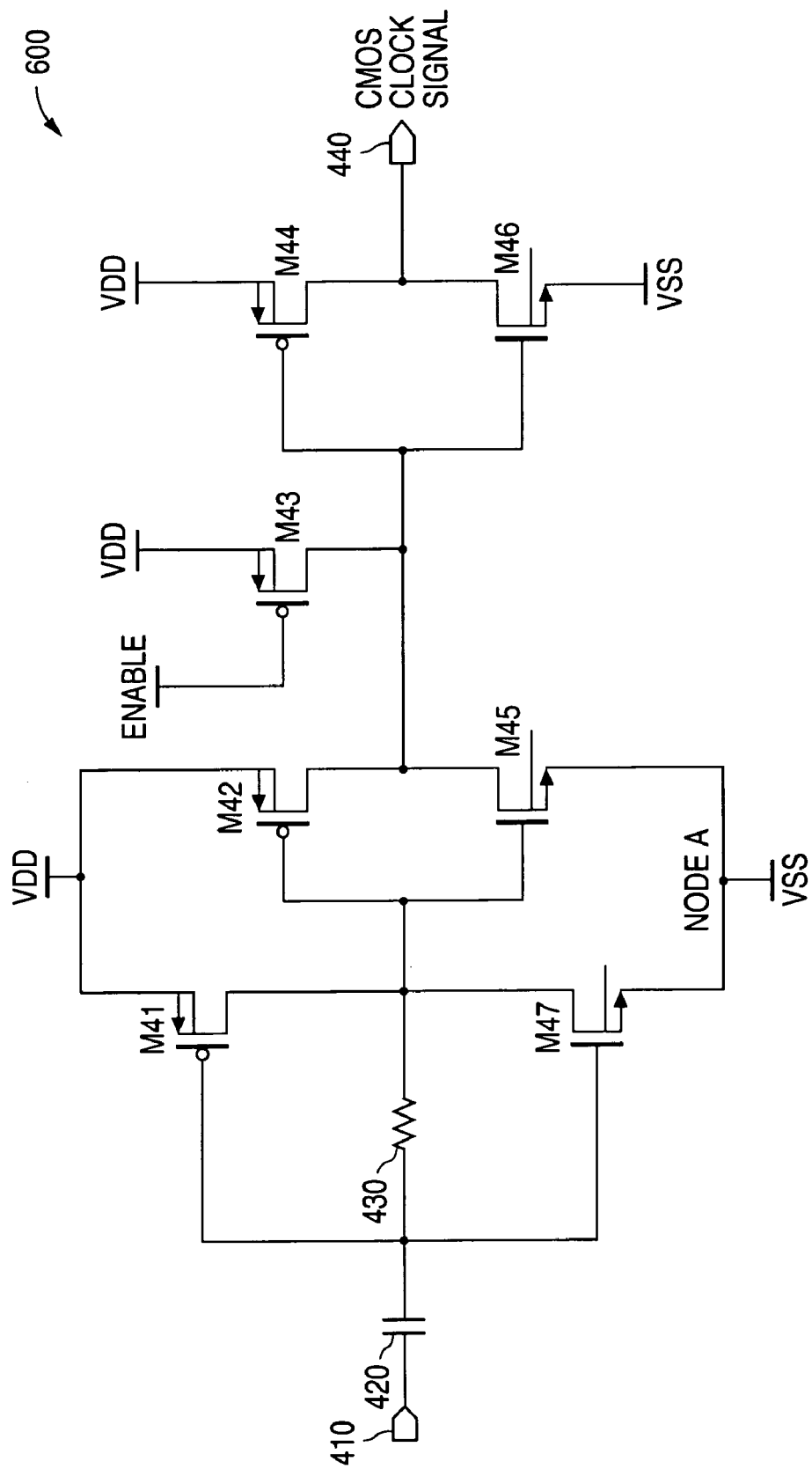
FIG. 6 illustrates a circuit diagram of the amplifier unit of the invention shown in FIG. 4 minus two transistors that function as a low pass filter.

FIG. 6 illustrates a circuit diagram that illustrates the amplifier unit 220 as shown in FIG. 4 minus transistor M48 and minus transistor M49. The circuit shown in FIG. 6 will be designated with reference numeral 600. In the circuit shown in FIG. 6 the negative VSS power supply is coupled directly to Node A. The source of transistor 47 and the source of transistor 45 are both coupled directly to the negative VSS power supply. The circuit shown in FIG. 6 has been described in order to illustrate the level of jitter that occurs when the low pass filter structure (M48, M49) is removed so that the negative VSS power supply is coupled directly to Node A.

Assume that the interpolated clock signal that is output from phase interpolator 210 is provided to the input node 410 of the amplifier circuit 600 shown in FIG. 6. The CMOS clock signal from output node 440 of amplifier circuit 600 is provided to input node 520 and input node 530 of the data sampling comparator 510. This configuration represents a non-regulated interpolator circuit. The difference between the positive VDD power supply voltage and the CMOS output clock signal is the measured to determine how well the CMOS clock signal tracks the value of the positive VDD power supply voltage over time. The measurement results are shown in the first graph shown in FIG. 7A.

Figure 7A:
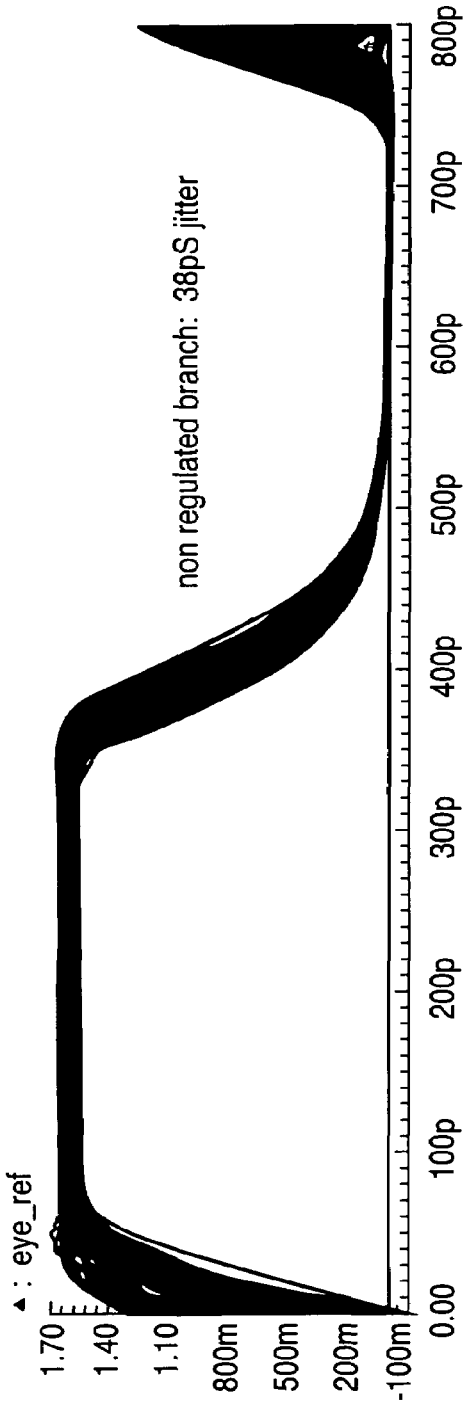
FIG. 7A illustrates a first graph that shows an eye diagram that plots the difference between a positive VDD supply voltage and an output clock signal as a function of time for a non-regulated interpolator circuit.

FIG. 7A illustrates a first graph that shows an eye diagram that plots the difference between the positive VDD power supply voltage and the output clock signal as a function of time for the non-regulated interpolator circuit described above. As shown in FIG. 7A the non-regulated interpolator circuit creates approximately thirty eight picoseconds (38 psec) of clock jitter. A picosecond is $10^{-12}$ second.

Now consider the operation of a regulated interpolator circuit in which the interpolated clock signal that is output from phase interpolator 210 is provided to the input node 410 of the amplifier circuit 220 shown in FIG. 4. The CMOS clock signal from output node 440 of amplifier circuit 220 is provided to input node 520 and input node 530 of the data sampling comparator 510. This configuration represents a regulated interpolator circuit. The difference between the positive VDD power supply voltage and the CMOS output clock signal is the measured to determine how well the CMOS clock signal tracks the value of the positive VDD power supply voltage over time. The measurement results are shown in the second graph shown in FIG. 7B.

Figure 7B:
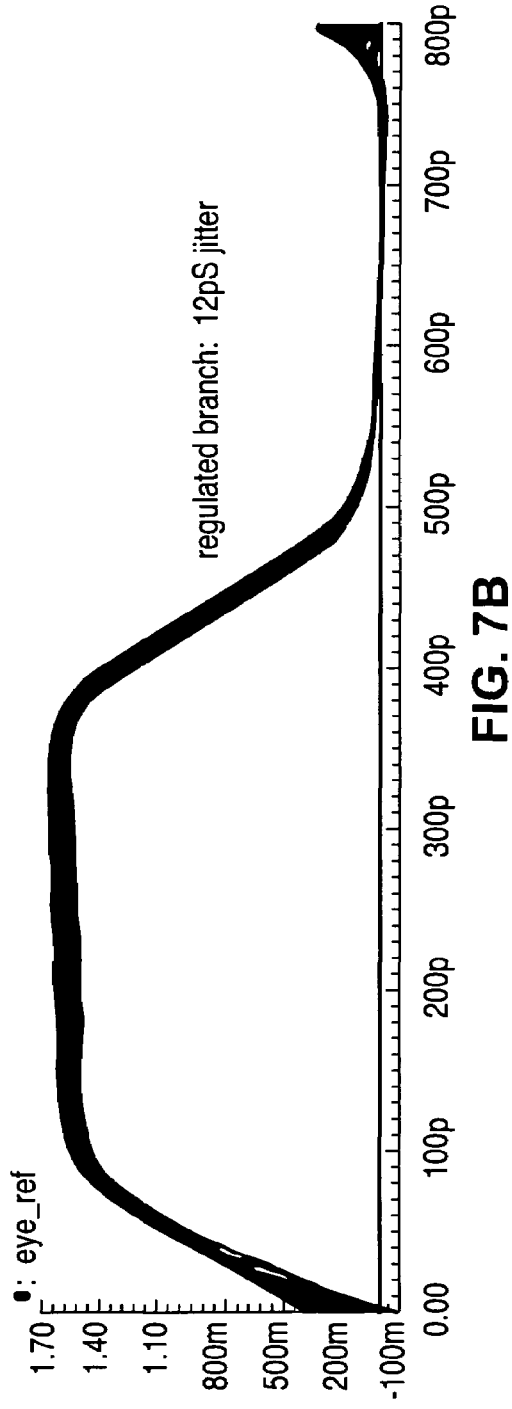
FIG. 7B illustrates a second graph that shows an eye diagram that plots the difference between a positive VDD supply voltage and an output clock signal as a function of time for a regulated interpolator circuit of the present invention.

FIG. 7B illustrates a second graph that shows an eye diagram that plots the difference between the positive VDD power supply voltage and the output clock signal as a function of time for the regulated interpolator circuit described above. As shown in FIG. 7B the regulated interpolator circuit creates approximately twelve picoseconds (12 psec) of clock jitter.

Therefore the regulated interpolator circuit (utilizing the amplifier circuit 220 of FIG. 4) reduces the level of clock jitter by more than three (3) times. That is, the level of clock jitter of the regulated interpolator circuit is less than one third of the level of clock jitter of the non-regulated interpolator circuit. This result is illustrative of the improvement in reducing clock jitter that is provided by the present invention.

Although the present invention has been described with an exemplary embodiment, various changes and modifications may be suggested to one skilled in the art. It is intended that the present invention encompass such changes and modifications as fall within the scope of the appended claims.

What is claimed is:

1. For use in a clock and data recovery circuit, a low jitter data receiver that comprises:
   a data sampling comparator that is operable to sample an input data stream with minimal jitter due to power supply noise, wherein the data sampling comparator comprises:
   a first latch operable to receive a first strobe signal on a first clock phase; and
   a second latch operable to receive a second strobe signal on a second clock phase that is opposite to the first clock phase;
   wherein the first strobe signal is referenced to a positive power supply voltage of the data sampling comparator.

2. The low jitter data receiver as set forth in claim 1 wherein said data sampling comparator further comprises differential output levels that are compatible with standard complementary metal oxide semiconductor (CMOS) logic.

3. The low jitter data receiver as set forth in claim 1 wherein said data sampling comparator consumes less static power than a current mode logic (CML) D flip flop circuit.

4. The low jitter data receiver as set forth in claim 1 wherein said first strobe signal latches data in said first latch by turning off p-channel metal oxide semiconductor (PMOS) devices in said first latch.

5. The low jitter data receiver as set forth in claim 1 wherein said second latch of said data sampling comparator is strobed approximately one half of a clock cycle after said first latch is strobed; and wherein said second latch is strobed at full complementary metal oxide semiconductor (CMOS) logic levels.

6. The low jitter data receiver as set forth in claim 1, wherein the second latch is operable to sample an output of the first latch.

7. A low jitter data receiver, comprising:

a data sampling comparator that is operable to sample an input data stream;

a phase interpolator; and an amplifier unit having an input coupled to an output of said phase interpolator and having an output coupled to an input of said data sampling comparator, wherein the amplifier unit comprises:

a first inverter circuit comprising a first p-channel metal oxide semiconductor (PMOS) transistor and a first n-channel metal oxide semiconductor (NMOS) transistor; and a second inverter circuit coupled to an output of said first inverter circuit, the second inverter circuit comprising a second p-channel metal oxide semiconductor (PMOS) transistor and a second n-channel metal oxide semiconductor (NMOS) transistor;

wherein a source of the first PMOS transistor and a source of the second PMOS transistor are coupled to a positive power supply voltage; and wherein a source of the first NMOS transistor and a source of the second NMOS transistor are coupled to a local negative power supply node.

8. The low jitter data receiver as set forth in claim 7 wherein said phase interpolator and said amplifier unit provide to said data sampling comparator a single ended clock signal that is relatively immune to power supply noise.

9. The low jitter data receiver as set forth in claim 7 wherein said phase interpolator comprises:

a first differential pair fed with a first clock signal and a first clock signal complement; and a second differential pair fed with a second clock signal and a second clock signal complement;

wherein said second clock signal is offset in phase from said first clock signal.

10. The low jitter data receiver as set forth in claim 9 wherein said first clock signal and said second clock signal in said phase interpolator are offset in phase by ninety degrees.

11. The low jitter data receiver as set forth in claim 9 wherein said phase interpolator further comprises:

a first current mode digital to analog converter coupled to said first differential pair for biasing said first differential pair; and a second current mode digital to analog converter coupled to said second differential pair for biasing said second differential pair.

12. The low jitter data receiver as set forth in claim 11 wherein said phase interpolator further comprises:

a current mirror circuit coupled to a transistor of said first differential pair and to a transistor of said second differential pair;

wherein said current mirror circuit converts a differential sum signal to a single ended signal that is referenced to the positive power supply voltage.

13. The low jitter data receiver as set forth in claim 12 wherein said phase interpolator further comprises:

a third p-channel metal oxide semiconductor (PMOS) transistor configured as an inversion capacitor for reducing power supply noise, said third PMOS transistor coupled to a common source node of said first differential pair and coupled to the positive power supply voltage; and a fourth p-channel metal oxide semiconductor (PMOS) transistor configured as an inversion capacitor for reducing power supply noise, said fourth PMOS transistor coupled to a common source node of said second differential pair and coupled to the positive power supply voltage.

14. The low jitter data receiver as set forth in claim 7 wherein said amplifier unit further comprises:

a low pass filter coupled to said local negative power supply node.

15. The low jitter data receiver as set forth in claim 14 wherein said low pass filter of said amplifier unit comprises:

a third p-channel metal oxide semiconductor (PMOS) transistor configured as an inversion capacitor of said low pass filter, said third PMOS transistor coupled to said local negative power supply node and coupled to the positive power supply voltage; and a third n-channel metal oxide semiconductor (NMOS) transistor configured as a resistor of said low pass filter, said third NMOS transistor coupled to said local negative power supply node in parallel with said third PMOS transistor configured as an inversion capacitor.

16. The low jitter data receiver as set forth in claim 15 wherein an output signal of said amplifier unit comprises:

a complementary metal oxide semiconductor (CMOS) clock signal in which a value of a quantity represented by the positive power supply voltage minus a value of the CMOS clock signal is substantially constant.

17. The low jitter data receiver as set forth in claim 15 wherein said low pass filter of said amplifier unit reduces an unregulated level of clock jitter by at least one third.

18. The low jitter data receiver as set forth in claim 7, wherein the data sampling comparator is operable to sample the input data stream with minimal jitter due to power supply noise.

19. For use in a clock and data recovery circuit, a low jitter data receiver that comprises:

a phase interpolator;

an amplifier unit having an input coupled to an output of said phase interpolator; and a data sampling comparator having an input coupled to an output of said amplifier unit, wherein said data sampling comparator is operable to sample an input data stream with minimal jitter due to power supply noise.

20. The low jitter data receiver as set forth in claim 19 wherein said data sampling comparator comprises:

differential output levels that are compatible with standard complementary metal oxide semiconductor (CMOS) logic; and circuitry that consumes less static power than a current mode logic (CML) D flip flop circuit.

21. The low jitter data receiver as set forth in claim 19 wherein said phase interpolator comprises:

a first differential pair fed with a first clock signal and a first clock signal complement;

a second differential pair fed with a second clock signal and a second clock signal complement;
wherein said second clock signal is offset in phase from said first clock signal;
a first current mode digital to analog converter coupled to said first differential pair for biasing said first differential pair;
a second current mode digital to analog converter coupled to said second differential pair for biasing said second differential pair; and
a current mirror circuit coupled to a transistor of said first differential pair and to a transistor of said second differential pair;
wherein said current mirror circuit converts a differential sum signal to a single ended signal that is referenced to a positive power supply voltage of said phase interpolator.

22. The low jitter data receiver as set forth in claim 19 wherein said amplifier unit comprises:
a first inverter circuit comprising a first p-channel metal oxide semiconductor (PMOS) transistor and a first n-channel metal oxide semiconductor (NMOS) transistor;
a second inverter circuit coupled to an output of said first inverter circuit, said second inverter circuit comprising a second p-channel metal oxide semiconductor (PMOS) transistor and a second n-channel metal oxide semiconductor (NMOS) transistor;
wherein a source of said first PMOS transistor and a source of said second PMOS transistor are coupled to a positive power supply voltage; and
wherein a source of said first NMOS transistor and a source of said second NMOS transistor are coupled to a local negative power supply node;
a third p-channel metal oxide semiconductor (PMOS) transistor configured as an inversion capacitor, said third PMOS transistor coupled to said local negative power supply node and coupled to the positive power supply voltage; and
a third n-channel metal oxide semiconductor (NMOS) transistor configured as a resistor, said third NMOS transistor coupled to said local negative power supply node in parallel with said third PMOS transistor configured as an inversion capacitor.

* * * * *